United States Patent
Maeda et al.

(10) Patent No.: US 10,672,788 B2
(45) Date of Patent: Jun. 2, 2020

(54) SEMICONDUCTOR MEMORY DEVICE HAVING A MULTI-REGION SEMICONDUCTOR LAYER

(71) Applicant: TOSHIBA MEMORY CORPORATION, Tokyo (JP)

(72) Inventors: Yuya Maeda, Atsugi Kanagawa (JP); Hidenori Miyagawa, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/117,649

(22) Filed: Aug. 30, 2018

(65) Prior Publication Data
US 2019/0296039 A1 Sep. 26, 2019

(30) Foreign Application Priority Data
Mar. 23, 2018 (JP) .................. 2018-055416

(51) Int. Cl.
*H01L 27/11* (2006.01)
*H01L 29/423* (2006.01)
(Continued)

(52) U.S. Cl.
CPC .... *H01L 27/11582* (2013.01); *G11C 16/0483* (2013.01); *G11C 16/24* (2013.01);
(Continued)

(58) Field of Classification Search
CPC ......... H01L 27/11582; H01L 29/42344; H01L 29/66833; H01L 29/7926; G11C 16/0483; G11C 16/24
See application file for complete search history.

(56) References Cited

U.S. PATENT DOCUMENTS 8,017,993 B2 * 9/2011 Kidoh ............... H01L 29/42348
257/316
9,576,977 B2 * 2/2017 Yoo .................... H01L 21/31111
(Continued)

FOREIGN PATENT DOCUMENTS

JP 2014036034 A 2/2014

OTHER PUBLICATIONS

Jong Kyung Park et al., Surface-controlled Ultrathin (2nm) Poly-Si Channel Junctionless FET towards 3D NAND Flash Memory Applications, IEEE, Symposium on VLSI Technology Digest of Technical Papers, 2014, 2 pages.

*Primary Examiner* — Ida M Soward
(74) *Attorney, Agent, or Firm* — Kim & Stewart LLP

(57) ABSTRACT

A semiconductor memory device includes conductive layers and insulation layers alternately stacked along a first direction. A core member extends through the insulation layers and conductive layers. A semiconductor layer on an outer periphery of the core member has a first region facing a conductive layer of the stack and a second region adjacent to the first region and facing an insulation layer. The first region has a first thickness and a first impurity concentration. The second region has a second thickness that is greater than the first thickness and a second impurity concentration that is different from the first impurity concentration. A charge accumulation film is between the semiconductor layer and the conductive layer in a second direction crossing the first direction.

16 Claims, 17 Drawing Sheets

(51) Int. Cl.
*H01L 29/66* (2006.01)
*H01L 29/792* (2006.01)
*G11C 16/04* (2006.01)
*G11C 16/24* (2006.01)
*H01L 27/11582* (2017.01)

(52) U.S. Cl.
CPC .. *H01L 29/42344* (2013.01); *H01L 29/66833* (2013.01); *H01L 29/7926* (2013.01)

(56) References Cited

U.S. PATENT DOCUMENTS

| | | | |
|---|---|---|---|
| 9,711,526 B2* | 7/2017 | Noda | H01L 27/11582 |
| 9,741,735 B2* | 8/2017 | Lee | H01L 27/11582 |
| 9,754,954 B2* | 9/2017 | Higuchi | H01L 21/0262 |
| 9,859,337 B2* | 1/2018 | Ratnam | H01L 23/528 |
| 10,062,653 B2* | 8/2018 | Ito | H01L 29/7845 |
| 10,115,732 B2* | 10/2018 | Yu | H01L 21/0214 |
| 10,115,897 B1* | 10/2018 | Sato | H01L 45/1253 |
| 10,121,965 B1* | 11/2018 | Uno | H01L 27/2454 |
| 10,256,252 B1* | 4/2019 | Kanazawa | H01L 27/11582 |
| 10,332,904 B2* | 6/2019 | Yamabe | H01L 27/11582 |
| 2016/0064409 A1* | 3/2016 | Yaegashi | H01L 27/11582 257/325 |
| 2016/0197094 A1* | 7/2016 | Higuchi | H01L 27/11556 257/324 |
| 2016/0268277 A1* | 9/2016 | Nagashima | H01L 27/11556 |
| 2017/0221921 A1 | 8/2017 | Kanamori et al. | |
| 2017/0263780 A1* | 9/2017 | Sawa | H01L 27/11521 |
| 2018/0151588 A1* | 5/2018 | Tsutsumi | H01L 27/11582 |
| 2018/0277554 A1* | 9/2018 | Kaneko | H01L 27/11556 |

* cited by examiner

SEMICONDUCTOR MEMORY DEVICE HAVING A MULTI-REGION SEMICONDUCTOR LAYER

CROSS-REFERENCE TO RELATED APPLICATION

This application is based upon and claims the benefit of priority from Japanese Patent Application No. 2018-055416, filed Mar. 23, 2018, the entire contents of which are incorporated herein by reference.

FIELD

Embodiments described herein relate generally to a semiconductor memory device.

BACKGROUND

In order to increase storage density (memory capacity), a stacked semiconductor memory device in which memory cells are three-dimensionally arranged has been proposed. In such a stacked semiconductor memory device, gate electrode layers and insulation layers are alternately stacked on a semiconductor substrate. A semiconductor column penetrates the stacked body formed by the gate electrode and insulation layers. Memory cells are formed at the intersection of the gate electrode layers and the semiconductor column.

In a stacked semiconductor memory device, to further increase the storage density, it is conceivable to increase the number of stacked layers. However, since the length of the semiconductor column penetrating the stacked body must be increased, resistance of the semiconductor column will be increased. For that reason, there is a concern that problems will occur in memory operations.

DETAILED DESCRIPTION

Figure 1:
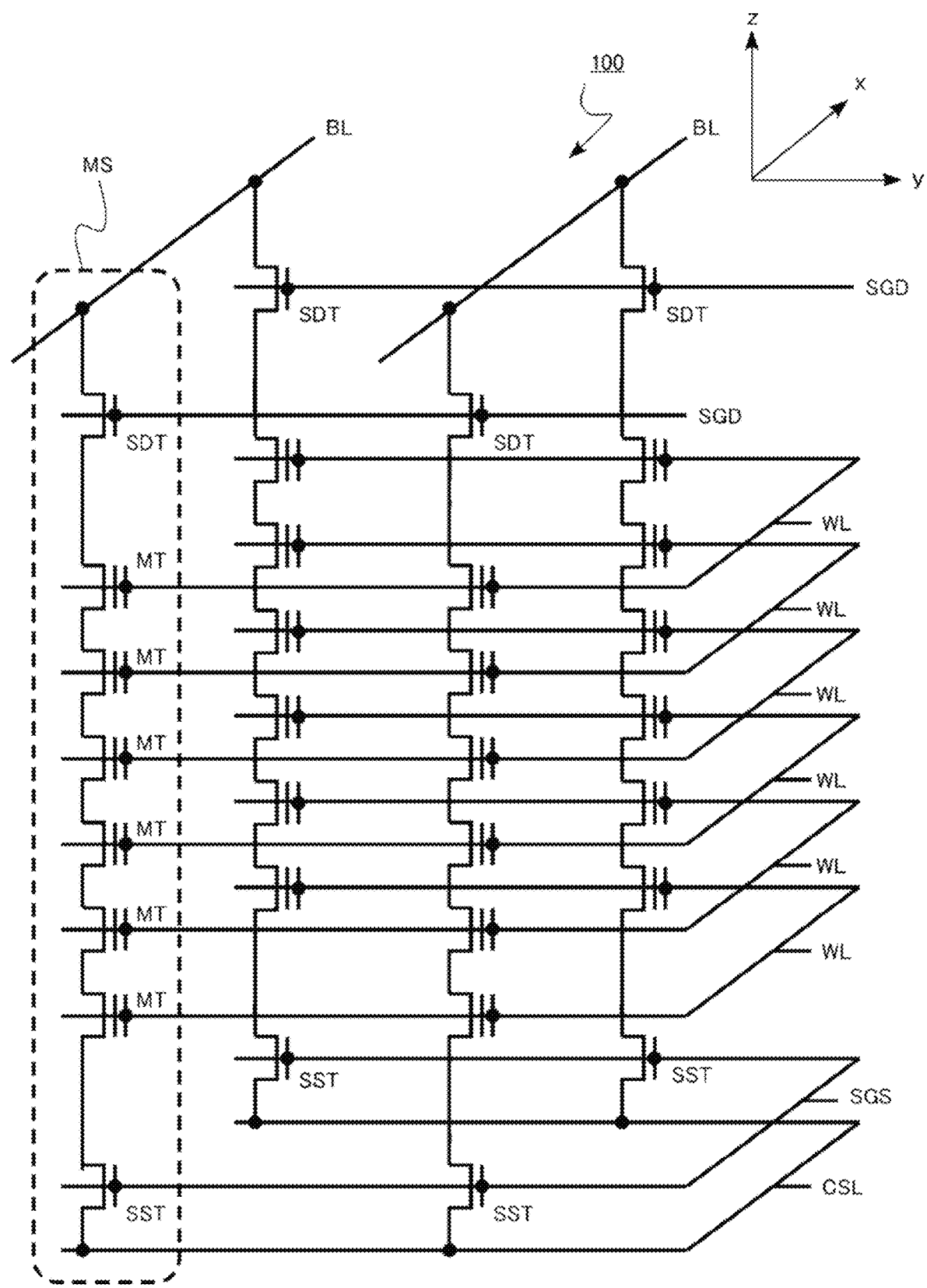
FIG. 1 is a circuit diagram of a memory cell array of a semiconductor memory device according to a first embodiment.

In general, according to one embodiment, a semiconductor memory device includes a plurality of conductive layers and a plurality of insulation layers alternately stacked along a first direction with the plurality of conductive layers. Each conductive layer is between a pair of insulation layers in the first direction. A core member extends in the first direction through the plurality of insulation layers and the plurality of conductive layers. A semiconductor layer is on an outer periphery of the core member and has a first region facing, in a second direction crossing the first direction, one of the conductive layer in the stack and a second region adjacent, in the first direction, to the first region and facing, in the second direction, one of the insulation layers. The first region has a first thickness along the second direction from the outer periphery of the core member and a first impurity concentration. The second region has a second thickness along the second direction from the outer periphery of the core member that is greater than the first thickness and a second impurity concentration that is different from the first impurity concentration. A charge accumulation film is between the semiconductor layer and the conductive layer in the second direction.

Hereinafter, example embodiments of the present disclosure will be described with reference to the drawings. In the following description, the same or similar components and the like are denoted by the same reference numerals, and explanation of these components once described may be omitted as appropriate.

In the present specification, the term "above" or "below" may be used for the sake of explanatory convenience. In this context, "above" and "below" are terms indicating a relative positional relationship within the drawing depictions and are not used as terms that define a positional relationship with respect to gravity.

Qualitative analysis and quantitative analysis of chemical composition of the components/aspects constituting a semiconductor device in the present specification can be carried out by secondary ion mass spectroscopy (SIMS), energy dispersive X-ray spectroscopy (EDX), for example. For measuring the thickness of the components in the semiconductor device, the distance between the components, a transmission electron microscope (TEM) can be used. It is possible to determine a conductivity type of a component and to determine a relationship between impurity concentration magnitudes in relation to other components in the semiconductor device by, for example, scanning capacitance microscopy (SCM).

First Embodiment

A semiconductor memory device of a first embodiment includes a stacked body in which insulation layers and conductive layers are alternately stacked along a first direction. A semiconductor column is provided in the stacked body and has a first region extending in the first direction, facing the conductive layer, and having a first film thickness and a first impurity concentration of a first conductivity type and a second region facing the insulation layer and having a second film thickness, thicker than the first film thickness, and a second impurity concentration of the first conductivity type that is higher than the first impurity concentration. A charge accumulation region is provided between the semiconductor column and the conductive layers.

The semiconductor memory device of the first embodiment is a three-dimensional NAND flash memory in which memory cells are three-dimensionally arranged.

Figure 2:
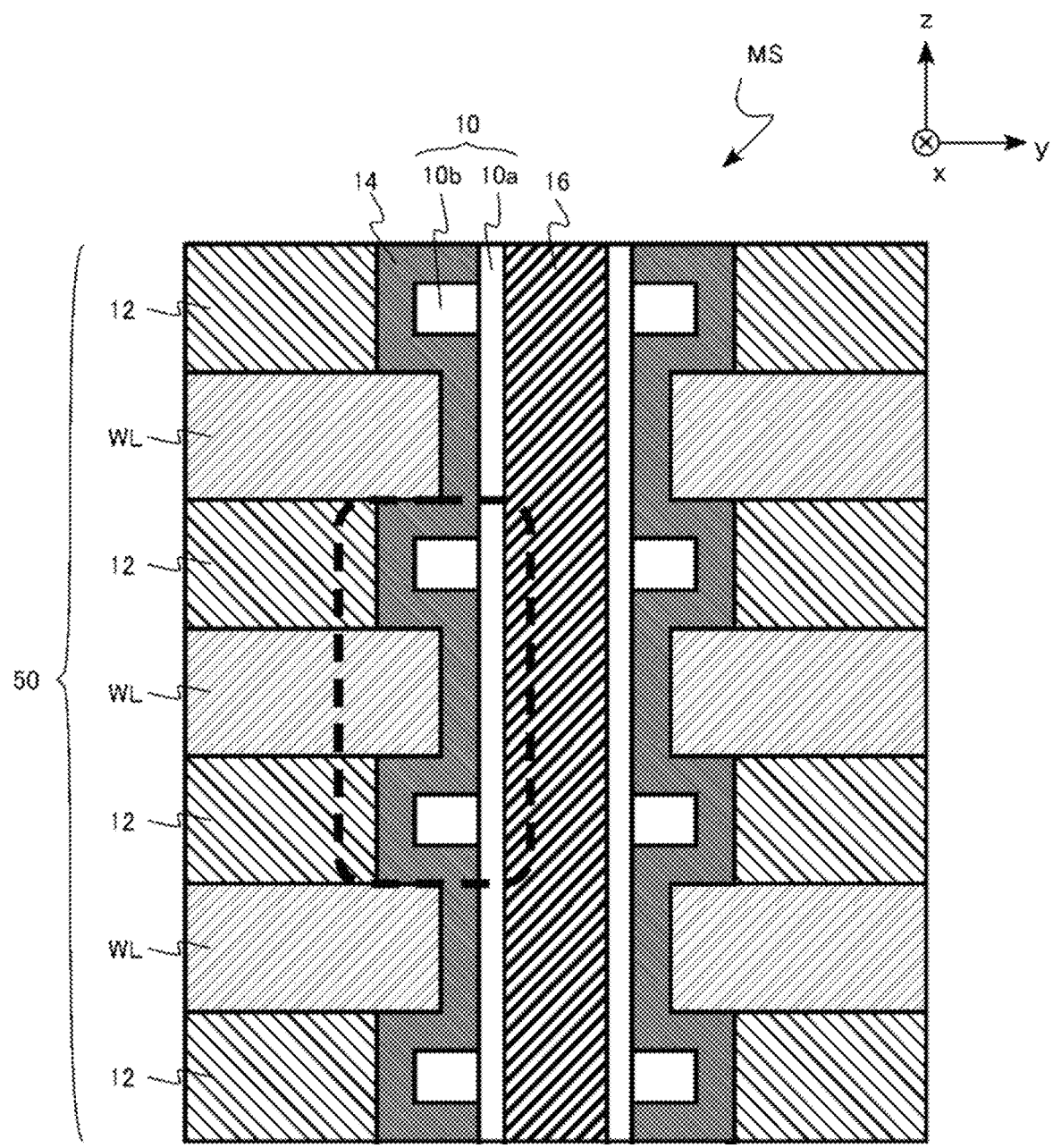
FIG. 2 is a schematic cross-sectional diagram of a portion of a memory string of a semiconductor memory device according to a first embodiment.

FIG. 1 is a circuit diagram of a memory cell array 100 of a semiconductor memory device according to a first embodiment. FIG. 2 is a schematic cross-sectional diagram of a portion of a memory string MS. FIG. 2 illustrates a cross section of a plurality of memory cell transistors MT on one memory string MS surrounded by a dotted line in the memory cell array 100 of FIG. 1.

As illustrated in FIG. 1, the memory cell array 100 is a three-dimensional NAND flash memory and includes a plurality of word lines WL, a common source line CSL, a source select gate line SGS, a plurality of drain select gate lines SGD, a plurality of bit lines BL, and a plurality of memory strings MS.

As illustrated in FIG. 1, the memory string MS has, connected in series, a source select transistor SST, a plurality of memory cell transistors MT, and a drain select transistor SDT between the common source line CSL and the bit line BL. Each memory string MS can be selected by the corresponding bit line BL and drain select gate line SGD, and each memory cell transistor MT can be selected by word line WL.

In the first embodiment, a case where the memory cell transistor MT is an n-channel transistor using electrons as carriers will be described as an example. In the first embodiment, a case where the first conductivity type is n-type will be described as an example.

As illustrated in FIG. 2, the memory cell array 100 includes a plurality of word lines WL (also referred to as conductive layers), a semiconductor layer 10 (also referred to as a semiconductor column), a plurality of interlayer insulation layers 12, a charge accumulation region 14, and a core insulation layer 16. The plurality of word lines WL and the plurality of interlayer insulation layers 12 form stacked body 50. The semiconductor layer 10 includes a channel layer 10a and an embedded portion 10b.

The word lines WL and the interlayer insulation layers 12 are provided on a semiconductor substrate (not illustrated).

The word lines WL and the interlayer insulation layers 12 are alternately stacked along the z-direction from the semiconductor substrate, where the z-direction is substantially orthogonal to a main surface of the semiconductor substrate.

Each word line WL is a planar conductor, such as a metal or other conductive material layer. The word line WL is, for example, a metal or a semiconductor. The word line WL is, for example, tungsten (W). The word line WL functions as a control electrode of a memory cell transistor MT or several memory cell transistors attached thereto (see FIG. 1). The word line WL is also referred to as a gate electrode layer in some instances.

The interlayer insulation layer 12 separates adjacent word lines WL. The interlayer insulation layer 12 is, for example, silicon oxide.

The word line WL is an example of a conductive layer. The interlayer insulation layer 12 is an example of an insulation layer.

The core insulation layer 16 is provided in the stacked body 50. The core insulation layer 16 extends in the z-direction. The core insulation layer 16 penetrates the stacked body 50. The core insulation layer 16 is surrounded by the semiconductor layer 10. The core insulation layer 16 is, for example, silicon oxide. The core insulation layer 16 is an example of an insulation member.

The semiconductor layer 10 is provided in the stacked body 50. The semiconductor layer 10 extends in the z-direction. The semiconductor layer 10 penetrates the stacked body 50. The semiconductor layer 10 is provided surrounding the core insulation layer 16 in the x-y plane. The semiconductor layer 10 has, for example, a cylindrical or columnar shape.

The semiconductor layer 10 has a channel layer 10a and embedded portions 10b. The channel layer 10a is provided to be between the core insulation layer 16 and the word line WL in the x-y plane and to be between the core insulation layer 16 and the interlayer insulation layer 12 in the x-y plane. The embedded portions 10b are provided between the core insulation layer 16 and the interlayer insulation layer 12.

The semiconductor layer 10 is, for example, an n-type semiconductor material. The semiconductor layer 10 is, for example, polycrystalline silicon.

The semiconductor layer 10 functions as a channel of the memory cell transistors MT.

The charge accumulation region 14 is provided between the semiconductor layer 10 and each word line WL. The charge accumulation region 14 is provided on an outer periphery of the semiconductor layer 10.

The charge accumulation region 14 has a function of accumulating charges according to an electric field applied thereto. It is also possible to apply an electric field to the charge accumulation region 14 to erase the charges previously accumulated. The charge accumulation region 14 also functions as a gate insulation film in the memory cell transistors MT.

Each memory cell transistor MT is formed by a word line WL, some portion of the charge accumulation region 14, and semiconductor layer 10. The memory cell transistors MT hold data as an amount of charge contained in the portion of the charge accumulation region 14.

Figure 3:
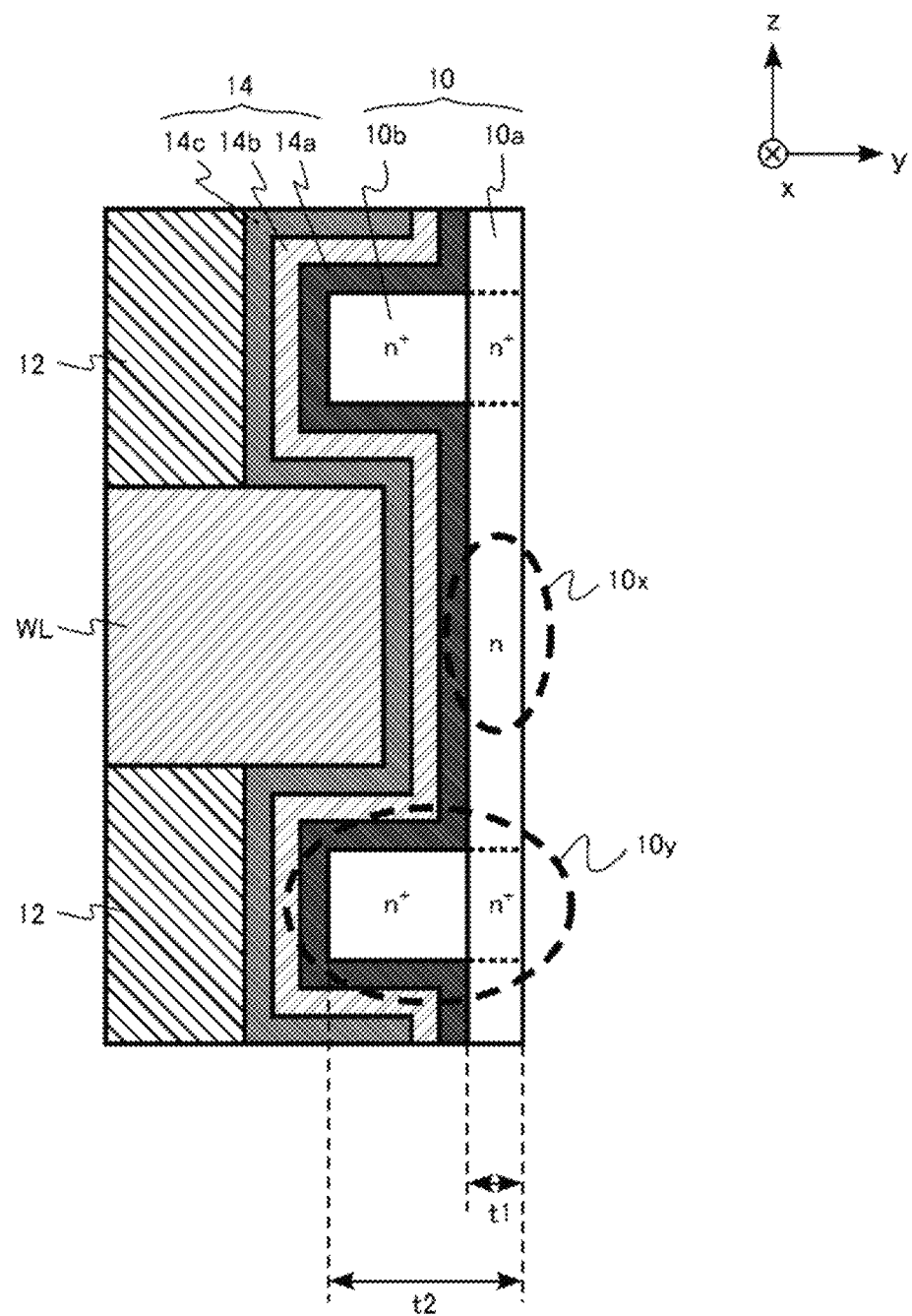
FIG. 3 is an enlarged schematic cross-sectional diagram of the portion of the memory string.

FIG. 3 is an enlarged schematic cross-sectional diagram of a portion of the memory string MS of the semiconductor memory device in the first embodiment. FIG. 3 illustrates a region surrounded by the dotted line in FIG. 2. In FIG. 3, specific illustration of the core insulation layer 16 is omitted for purposes of clarity. FIG. 3 illustrates a cross section of one memory cell transistor MT.

The semiconductor layer 10 has a channel region 10x and an embedded region 10y. The channel region 10x is referred to as a first region in some instances. The embedded region 10y is referred to as a second region in some instances.

The channel region 10x faces the word line WL in a direction parallel to x-y plane. The channel region 10x is an n-type semiconductor material. The channel region 10x has a first film thickness (t1 in FIG. 3) and a first n-type impurity concentration. The first film thickness t1 is equal to the film thickness of the channel layer 10a. The first film thickness t1 is a film thickness in a direction (e.g., y-direction) perpendicular to the z-direction.

The first film thickness t1 is, for example, between about 1 nm and about 5 nm. The first n-type impurity concentration is, for example, between about $1 \times 10^{17}$ $cm^{-3}$ and about $1 \times 10^{19}$ $cm^{-3}$.

The channel region 10x is, for example, a doped polycrystalline silicon containing n-type impurities. The n-type impurities are, for example, phosphorus (P) or arsenic (As).

The embedded region 10y faces the interlayer insulation layer 12 in a direction parallel to the x-y plane. The embedded region 10y is an n-type semiconductor material. The embedded region 10y has a second film thickness (t2 in FIG. 3) and a second n-type impurity concentration. The second film thickness t2 is thicker than the first film thickness t1. The second n-type impurity concentration is higher than the first n-type impurity concentration.

The second film thickness t2 adds the film thickness of the embedded portion 10b to the film thickness of the channel layer 10a. The second film thickness t2 is a film thickness in a direction (e.g., y-direction) perpendicular to the z-direction.

The second film thickness t2 is, for example, between about 4 nm and about 10 nm. The second film thickness t2 is at least about 3 nm thicker than the first film thickness t1. The second n-type impurity concentration is, for example, between about $1\times10^{19}$ cm$^{-3}$ and about $1\times10^{21}$ cm$^{-3}$.

For example, the n-type impurity concentration of the channel layer 10a in contact with the embedded region 10y is higher than the first n-type impurity concentration of the channel region 10x.

The embedded region 10y is, for example, doped polycrystalline silicon containing n-type impurities. The n-type impurities are, for example, phosphorus (P) or arsenic (As).

The channel layer 10a and the embedded portion 10b can be made of different semiconductor materials in some examples.

The memory cell transistors MT in the first embodiment do not have a source/drain junction. The memory cell transistors MT in this embodiment are so-called junctionless transistors. Each memory cell transistor MT is an n-channel transistor using electrons as carriers. The memory cell transistors MT are, for example, a normally ON type transistors, and are turned off by application of a negative bias to the respective word line WL, which depletes the channel region 10x and cuts off the channel.

The charge accumulation region 14 includes a tunnel insulation film 14a, a silicon nitride film 14b, and a block insulation film 14c. The tunnel insulation film 14a normally has an insulating property, but, in general, is a film that allows a tunnel current to flow when a predetermined electric field is applied. The tunnel insulation film 14a is, for example, silicon oxide, silicon oxynitride, silicon nitride, or stacked layers of these materials or the like. The silicon nitride film 14b has a function of accumulating charges. The block insulation film 14c has a function of preventing movement of charges between the silicon nitride film 14b and the word line WL. The block insulation film 14c is, for example, silicon oxide or aluminum oxide.

The memory cell transistor MT of the first embodiment has a so-called metal oxide nitride oxide semiconductor (MONOS) structure.

Next, a method of manufacturing the semiconductor memory device of the first embodiment will be described. In particular, a method of manufacturing the memory string MS including the memory cell transistor MT will be described.

FIGS. 4, 5, 6, 7, 8, 9, 10, 11, and 12 are schematic cross-sectional diagrams illustrating an example of the method of manufacturing the semiconductor memory device of the first embodiment.

Figure 4:
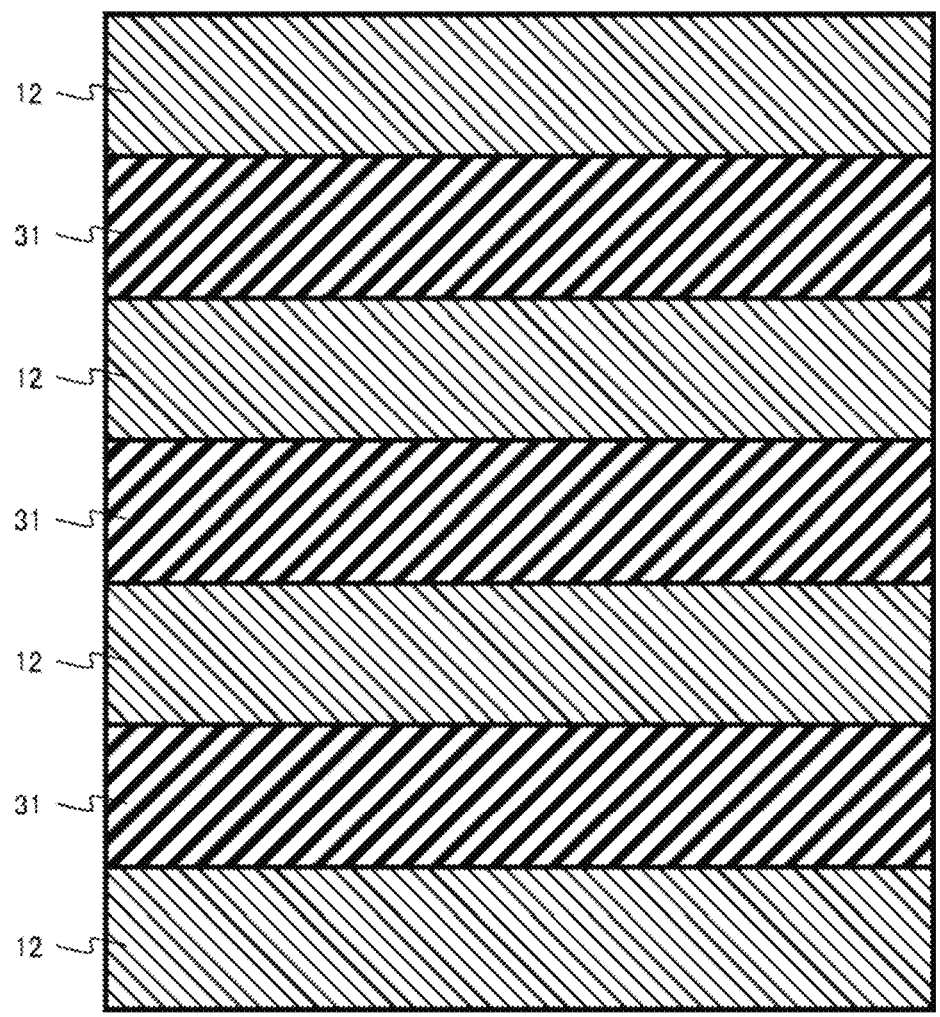
FIGS. 4 to 12 are schematic cross-sectional diagrams illustrating aspects of a manufacturing method of a semiconductor memory device according to a first embodiment.

First, the interlayer insulation layer 12 and the sacrificial layer 31 are alternately deposited on a semiconductor substrate (FIG. 4). The interlayer insulation layer 12 and the sacrificial layer 31 are formed by, for example, a chemical vapor deposition (CVD) method. The interlayer insulation layer 12 is, for example, silicon oxide. The sacrificial layer 31 is, for example, silicon nitride.

Figure 5:
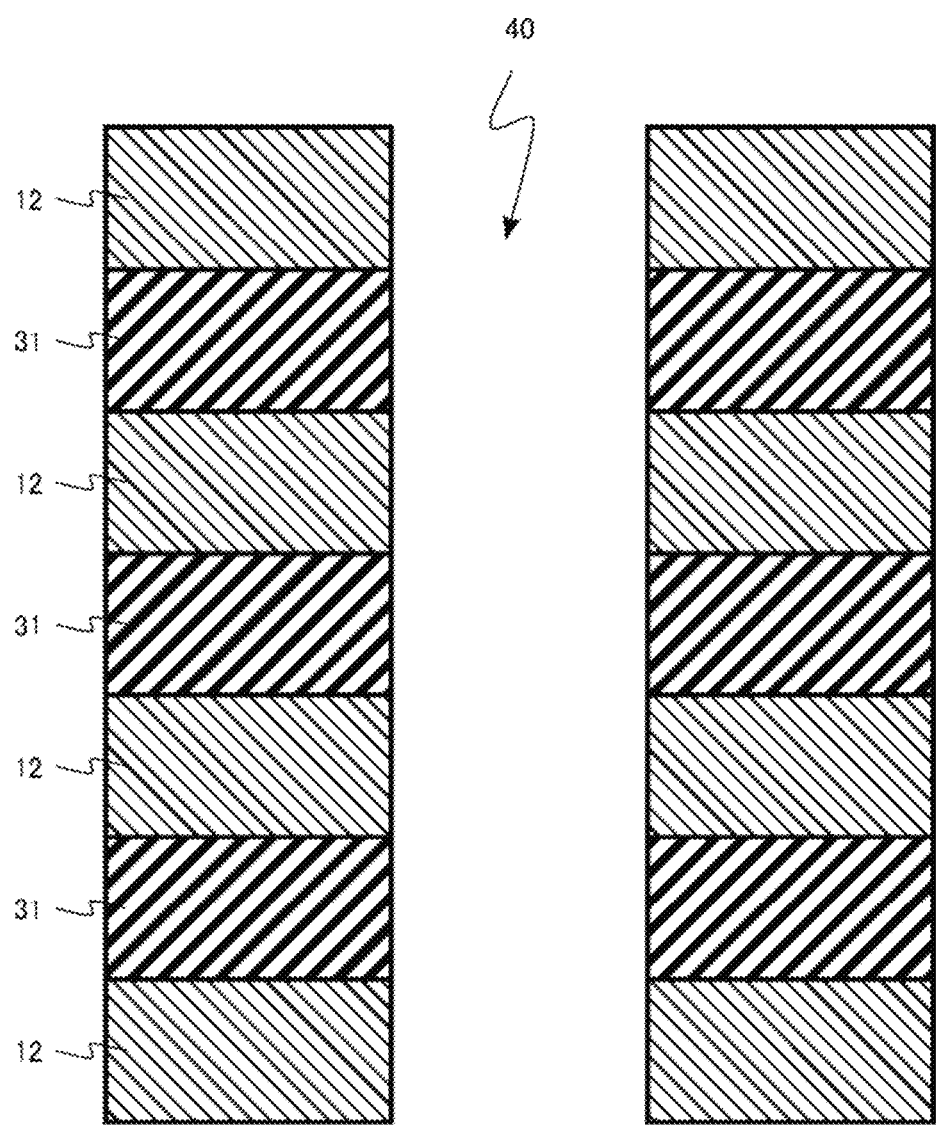

Next, an opening 40 penetrating through the interlayer insulation layer 12 and the sacrificial layer 31 is formed (FIG. 5). The opening 40 is formed by, for example, lithography and reactive ion etching (RIE).

Figure 6:
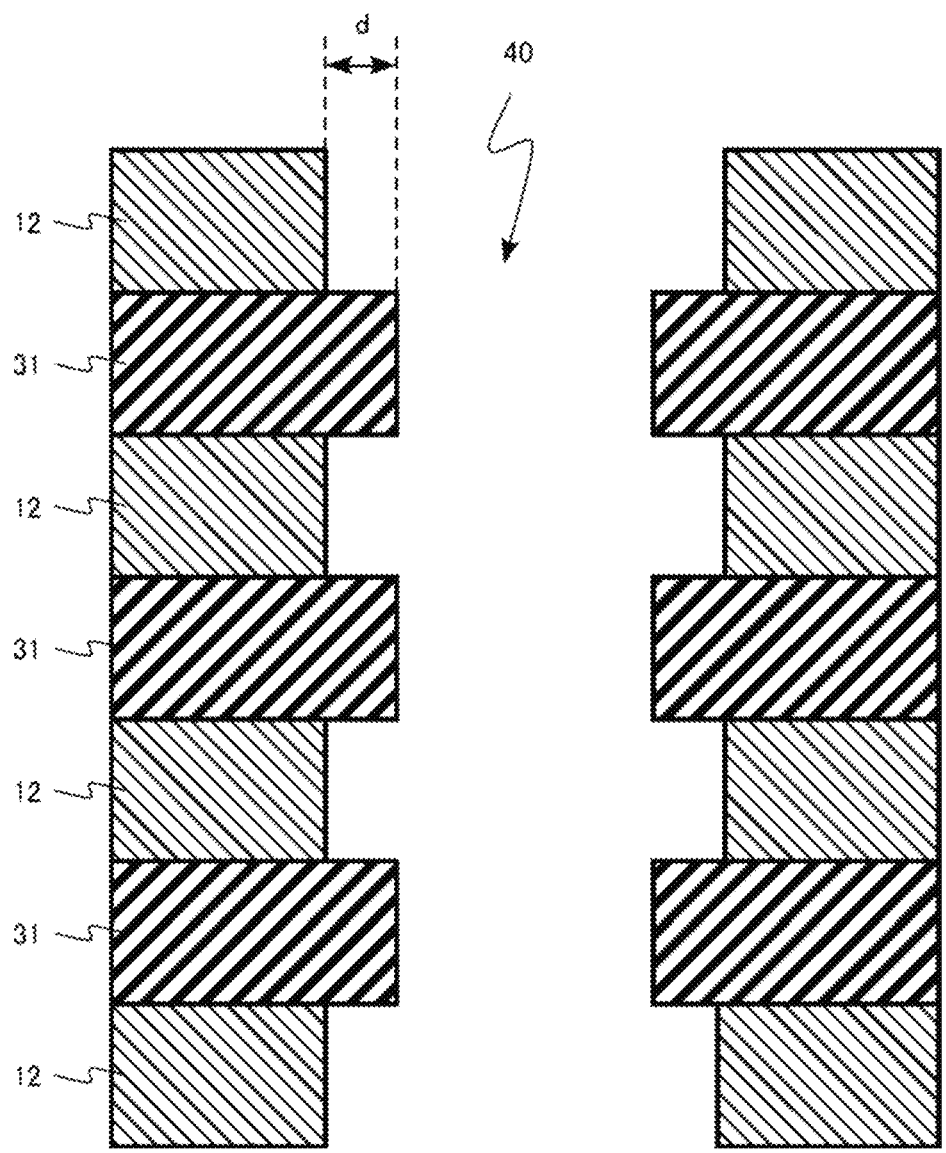

Next, recess etching for selectively retracting the interlayer insulation layer 12 within the opening 40 relative to the sacrificial layer 31 is performed (FIG. 6). For this recess etching, isotropic etching can be used. The isotropic etching is, for example, wet etching or dry etching which is substantially non-directional. The recess etching amount (dimension d in FIG. 6) is, for example, 1 nm to 5 nm.

Figure 7:
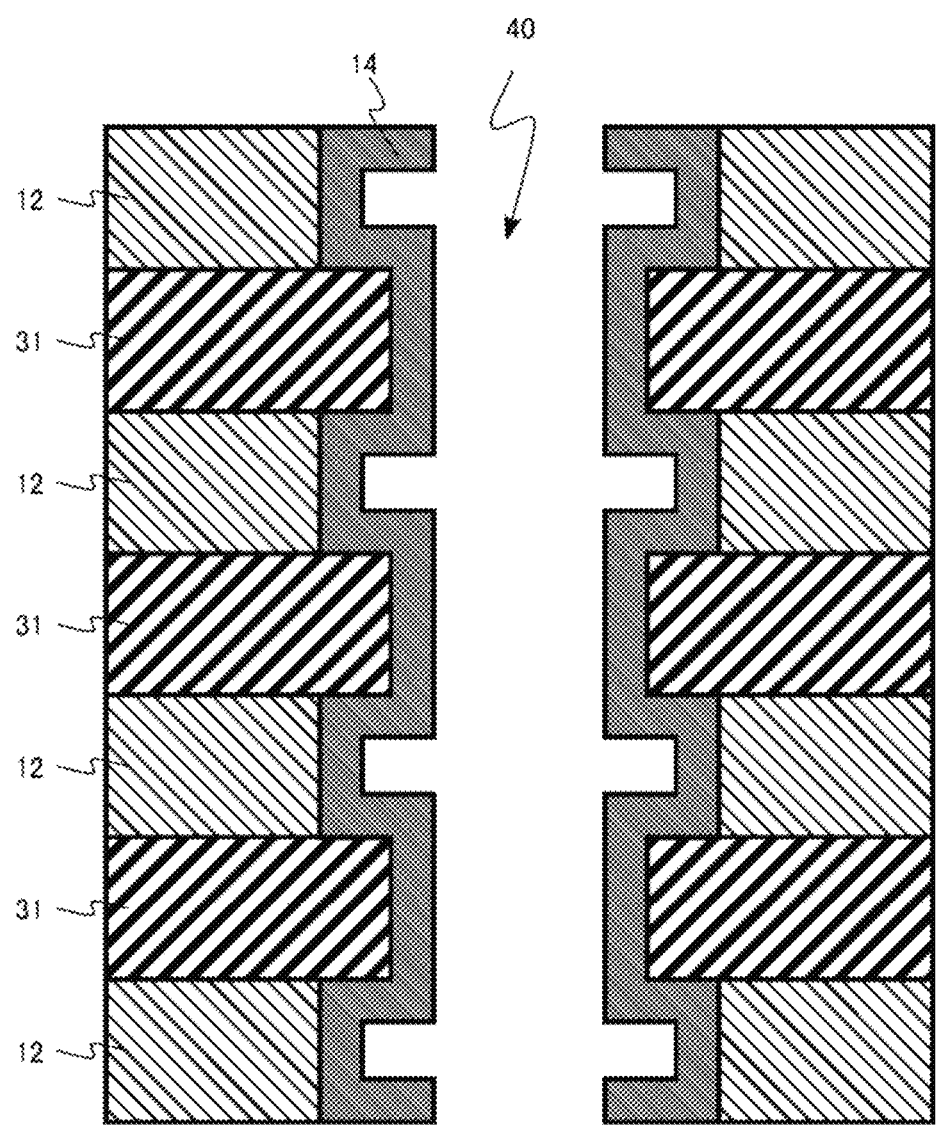

Next, the charge accumulation region 14 is formed in the opening 40 (FIG. 7). Formation of the charge accumulation region 14 is performed, for example, by a CVD method. For example, the charge accumulation region 14 is formed in the order of the block insulation film 14c, the silicon nitride film 14b, and the tunnel insulation film 14a.

Figure 8:
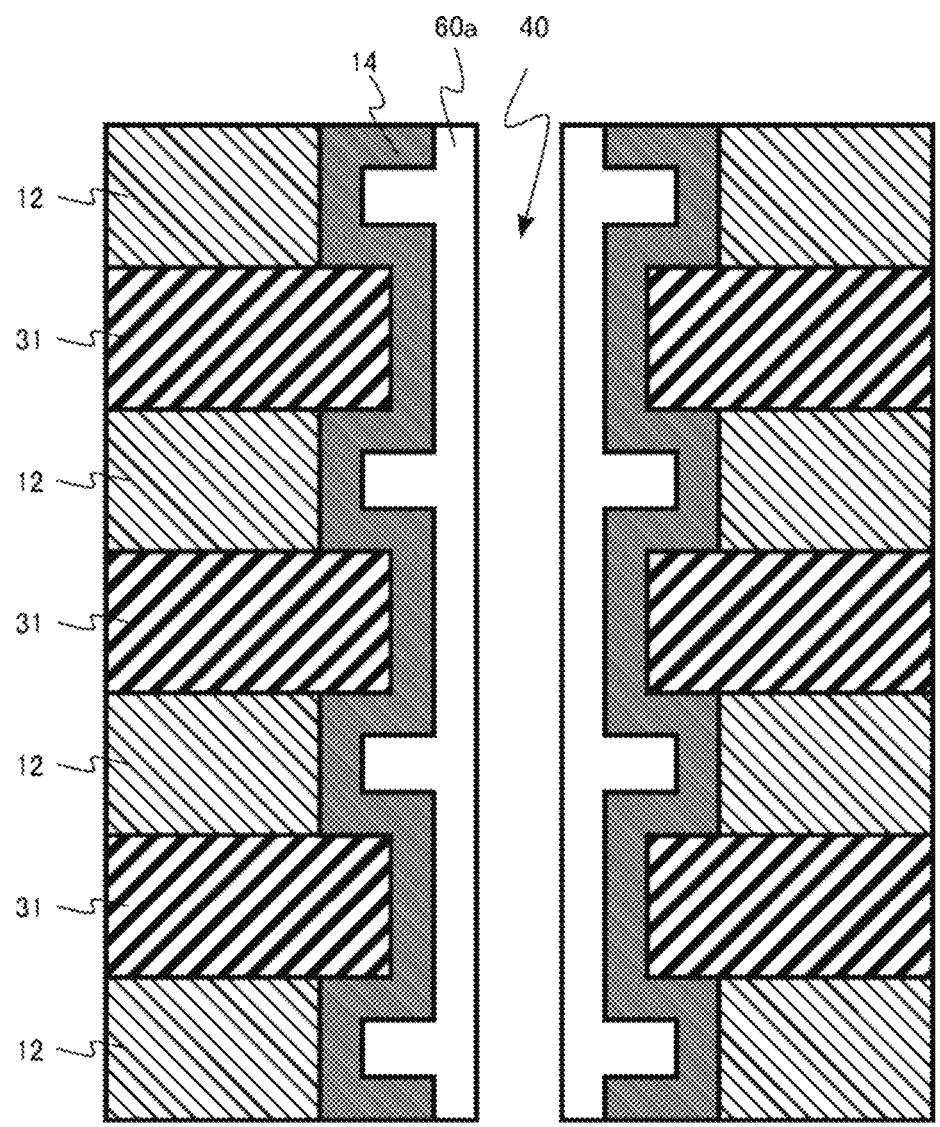

Next, a first semiconductor film 60a is formed in the opening (FIG. 8). Forming of the first semiconductor film 60a is performed by, for example, a CVD method. The first semiconductor film 60a is, for example, polycrystalline silicon doped with n-type impurities. The n-type impurities are, for example, phosphorus or arsenic.

Figure 9:
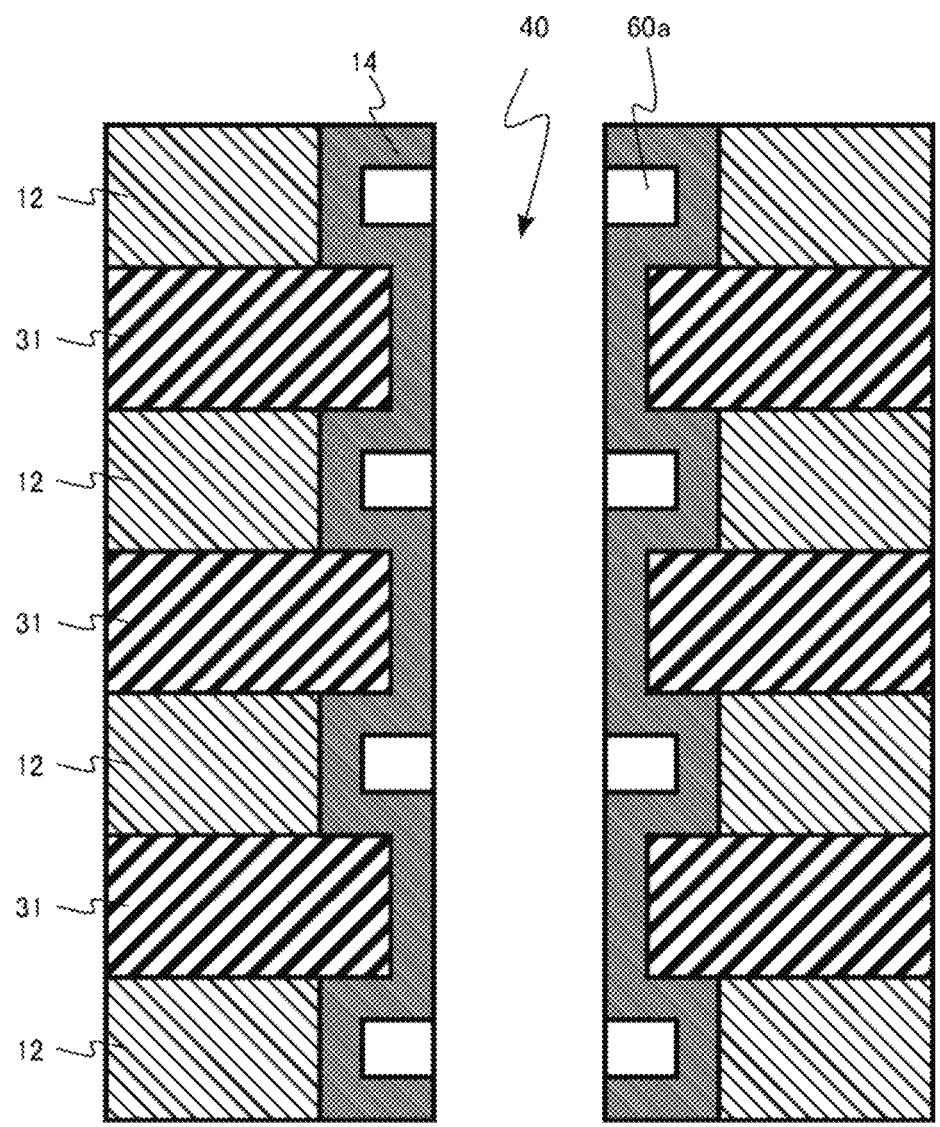

Next, a portion of the first semiconductor film 60a in the opening 40 is removed (FIG. 9). The remaining portion of the first semiconductor film 60a is left in a region where the interlayer insulation layer 12 was retracted by recess etching. For removal of non-recessed portions of the first semiconductor film 60a, for example, isotropic etching can be used. The isotropic etching is, for example, wet etching or dry etching. The remaining portion of the first semiconductor film 60a becomes the embedded portion 10b in the finished device.

Figure 10:
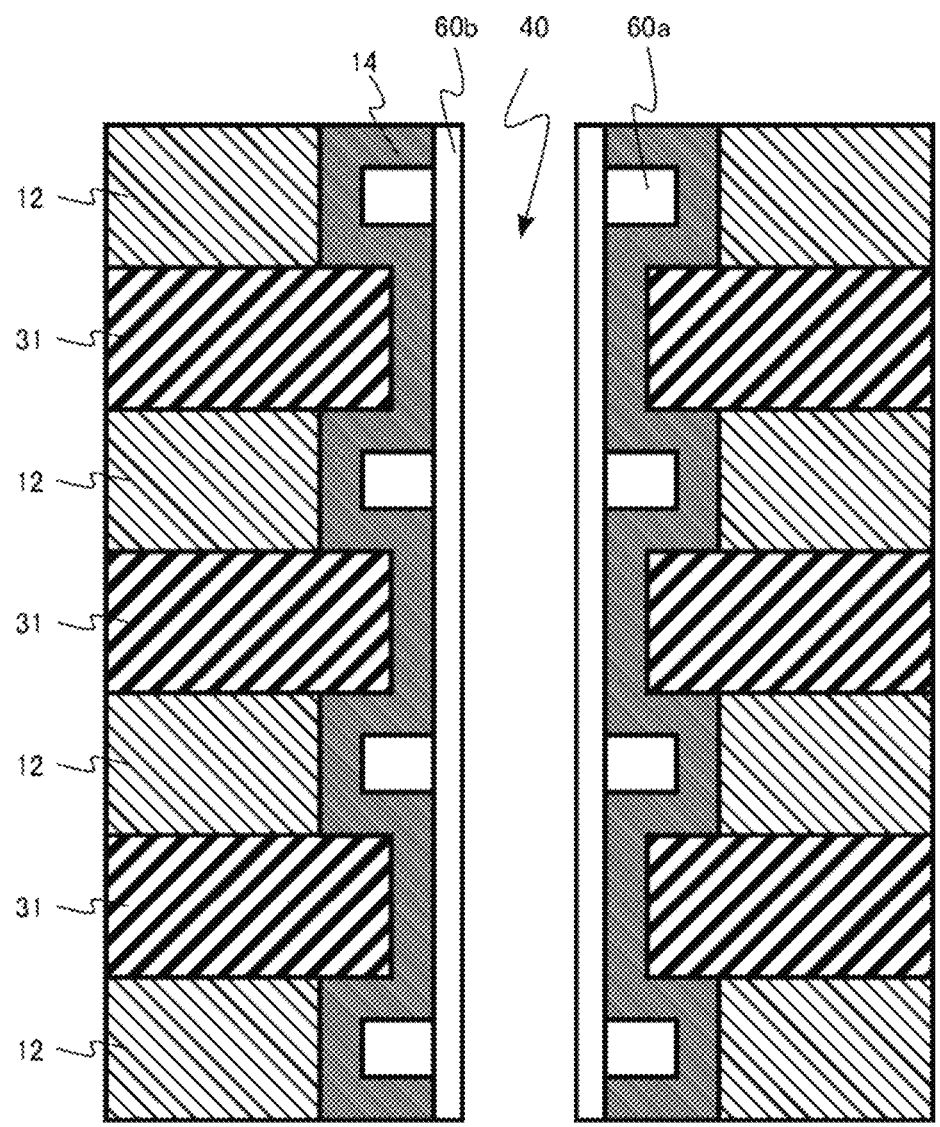

Next, a second semiconductor film 60b is formed in the opening 40 (FIG. 10). The second semiconductor film 60b is formed by, for example, a CVD method. The second semiconductor film 60b is, for example, polycrystalline silicon doped with n-type impurities. The n-type impurities are, for example, phosphorus or arsenic.

The n-type impurity concentration of the second semiconductor film 60b is lower than the n-type impurity concentration of the first semiconductor film 60a. The second semiconductor film 60b becomes the channel layer 10a in the finished device.

Figure 11:
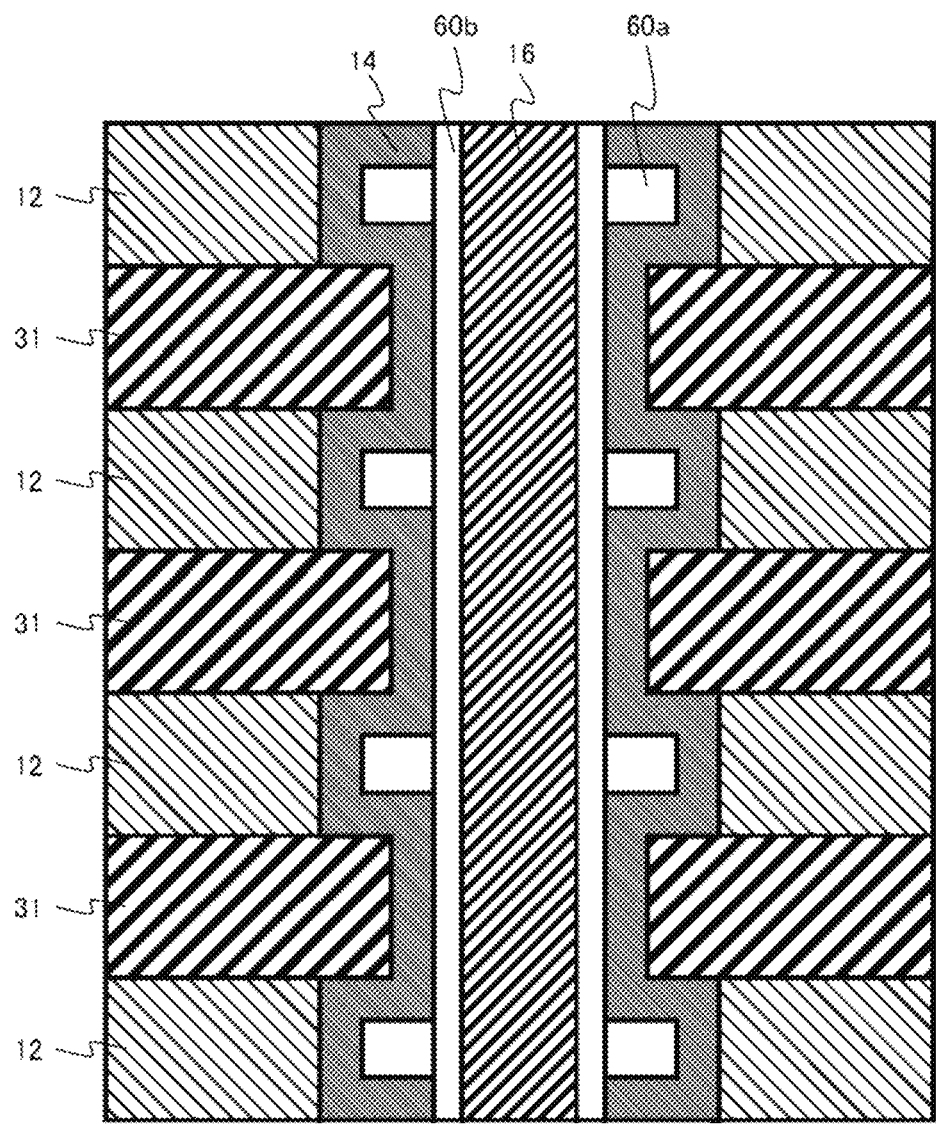

Next, the inside of the opening 40 is filled with the core insulation layer 16 (FIG. 11). The core insulation layer 16 is formed, for example, by a CVD method. The core insulation layer 16 is, for example, silicon oxide.

Figure 12:
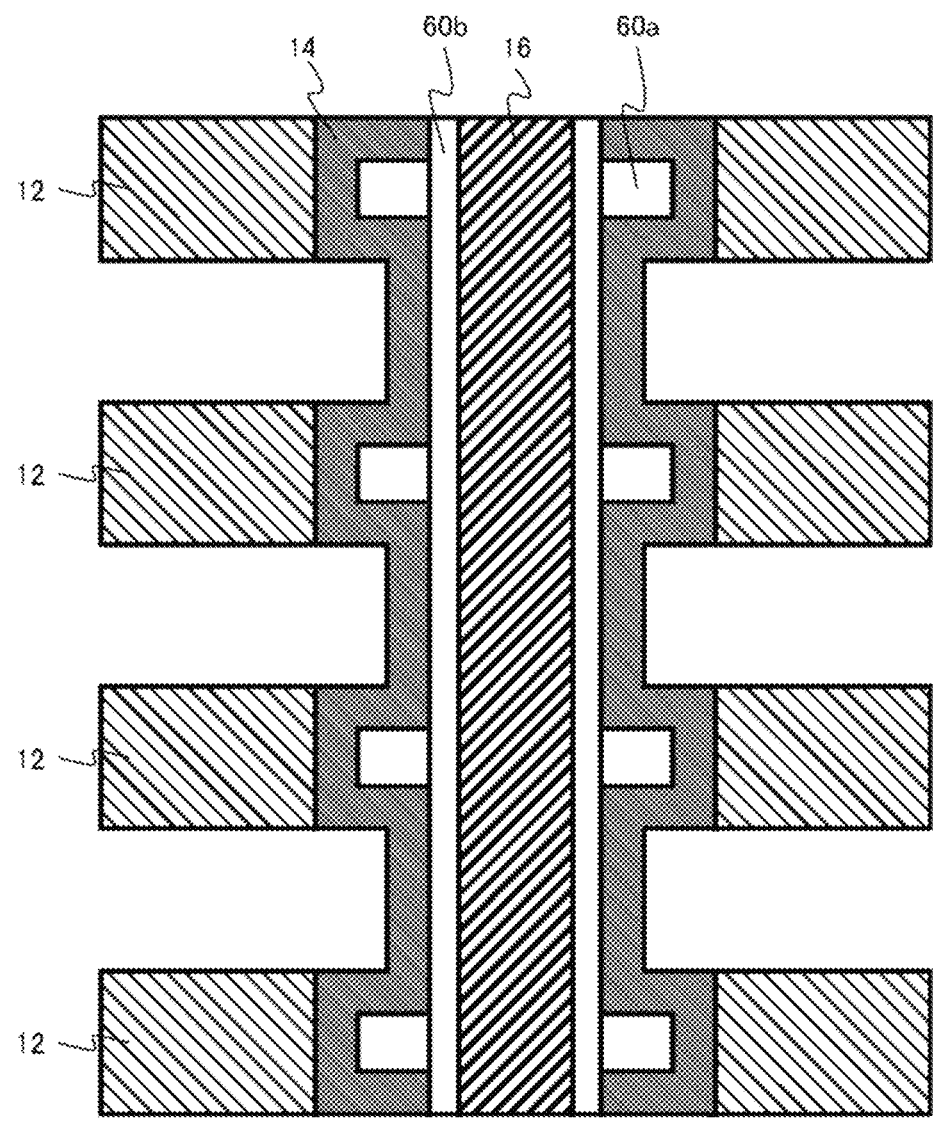

Next, the sacrificial layer 31 is selectively etched and removed (FIG. 12). The sacrificial layer 31 is etched, for example, in a wet etching process.

Next, the material of the word line WL is formed in space from which the sacrificial layer 31 has been removed. The material of the word line WL is embedded, for example, by a CVD method. The material of the word line WL is, for example, tungsten (W).

By the manufacturing method described above, the semiconductor memory device of the first embodiment illustrated in FIG. 2 is manufactured.

Next, certain actions and effects in a semiconductor memory device according to the first embodiment will be described.

Figure 13:
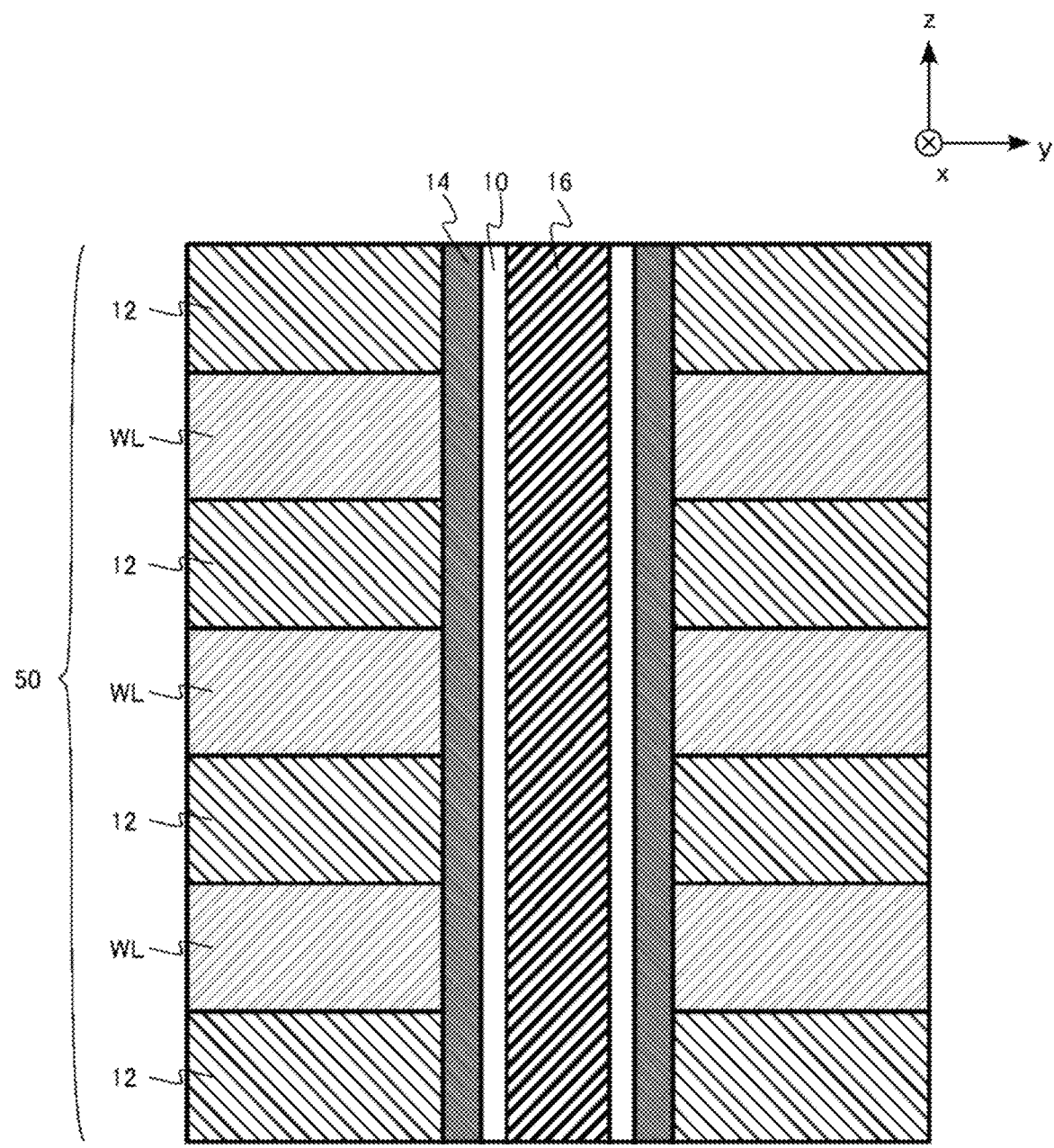
FIG. 13 is a schematic cross-sectional diagram of a portion of a memory string of a semiconductor memory device according to a comparative example.

FIG. 13 is a schematic cross-sectional diagram of a portion of the memory string MS of a semiconductor memory device according to a comparative example. The semiconductor memory device according to the comparative example is different from that of the first embodiment in that the embedded portion 10b is not included. The semiconductor layer 10 of the semiconductor memory device according to the comparative example includes only a layer corresponding to the channel layer 10a.

Figure 14A:
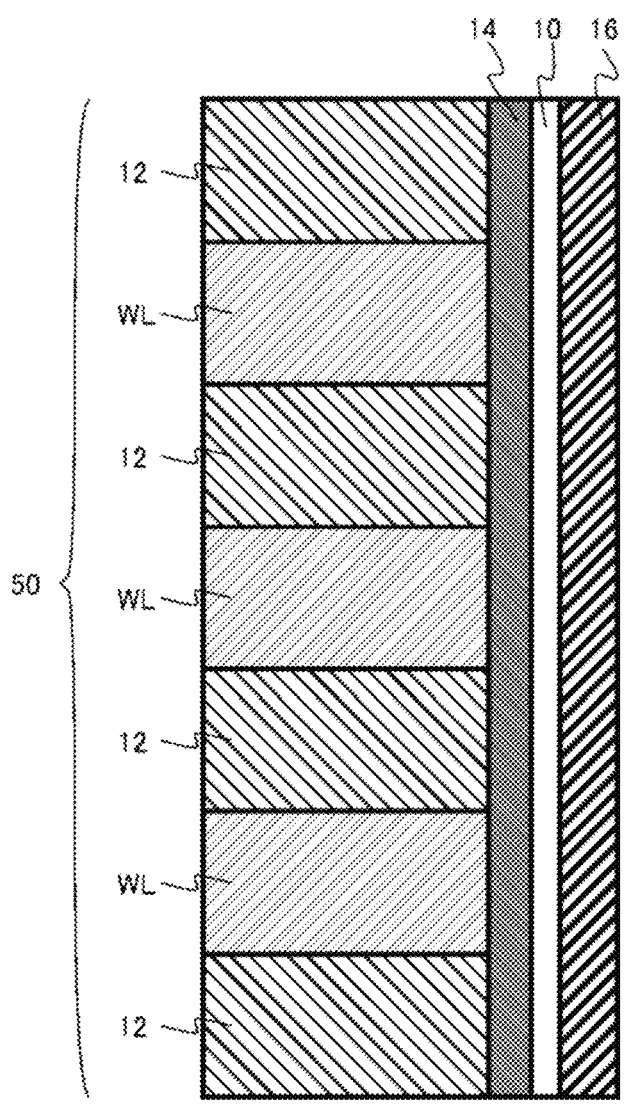
FIGS. 14A and 14B are explanatory diagrams of certain aspects of a semiconductor memory device according to a first embodiment relative the comparative example.
Figure 14B:
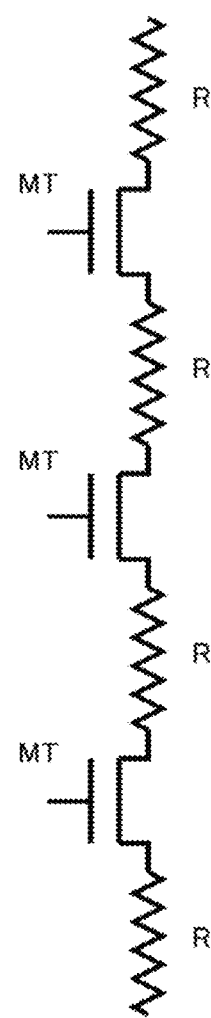

FIG. 14A is a schematic cross-sectional diagram of a portion of the memory string MS of the semiconductor memory device according to the comparative example. FIG. 14B is a circuit diagram of the memory string.

With miniaturization of semiconductor memory devices, the film thickness of the semiconductor layer 10 generally becomes thinner, as such the resistance of the semiconductor layer 10 increases and therefor the resistance along the memory string MS increases. In particular, in a region of the semiconductor layer 10 facing the interlayer insulation layer 12, which is relatively difficult to influence with the voltage of the word lines WL, a large parasitic resistance (R in FIG. 14 B) will be present in the memory string MS. When the resistance of the memory string MS increases, there is a concern that a problem may occur in writing data to the memory cell transistors MT and reading data from the memory cell transistors MT.

In a stacked semiconductor memory device, it is conceivable to increase the number of stacked layers to further increase storage density. However, resistance of the memory string MS increases as the memory string MS becomes longer as the number of stacked layers increases. This increase in resistance becomes an obstacle/limit with respect to increasing the number of stacked layers.

In the semiconductor memory device according to the first embodiment, the embedded region 10y has a film thickness that is thicker than the channel region 10x and a higher impurity concentration is provided in the region directly facing the interlayer insulation layer 12. Accordingly, the parasitic resistance R of the memory string can be reduced. Therefore, it is possible to reduce the resistance along the memory string MS. Thus, it is possible to increase the number of stacked layers of the stacked body 50 and achieve a semiconductor memory device having a large storage density.

Figure 15:
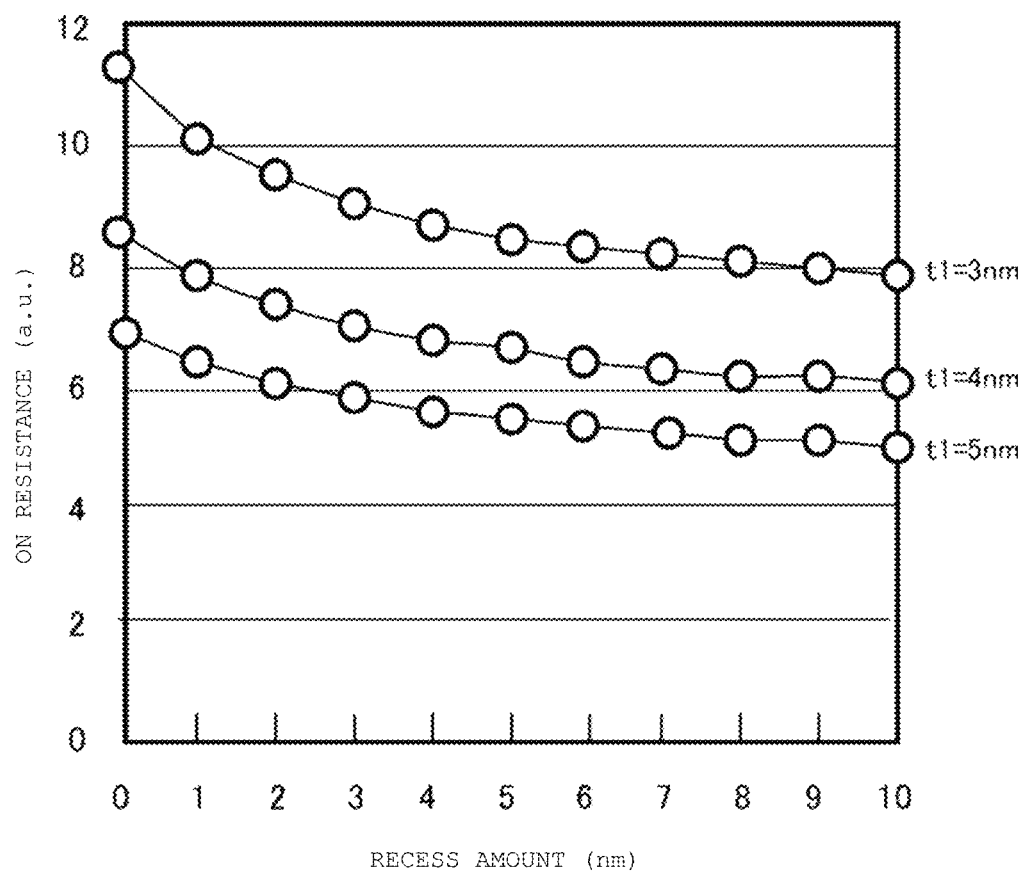
FIG. 15 is a graph depicting changes in on resistance for different recess amounts in certain semiconductor memory devices.

FIG. 15 is a graph for explaining certain aspects of a semiconductor memory device according to the first embodiment. FIG. 15 illustrates a calculation result of the ON resistance reduction effect associated with inclusion of the embedded portions 10b.

The horizontal axis is a recess amount (dimension d in FIG. 6) of the interlayer insulation layer 12. The recess amount is equal to the difference between the second film thickness of the embedded region 10y (t2 in FIG. 3) and the first film thickness of the channel region 10x (t1 in FIG. 3). The recess amount was varied in a range of 0 nm to 10 nm.

The vertical axis is the calculated ON resistance of the memory string MS. Here, it is assumed that there are 128 word line WL layers. The n-type impurity concentration of the channel region 10x was $5 \times 10^{18}$ cm$^{-3}$, and the n-type impurity concentration of the embedded region 10y was $1 \times 10^{19}$ cm$^{-3}$. The cases in which first film thickness t1 of the channel region 10x is 3 nm, 4 nm, and 5 nm were calculated.

As is apparent from FIG. 15, the ON resistance is reduced when recessing is performed to form the embedded region 10y (compare value at recess amount=0 to values at recess amount=1 to 10 nm). In general, the effect appears to saturate somewhat once the recess amount (that is, the difference between the second film thickness t2 and the first film thickness t1) becomes about 3 nm or more. Accordingly, from the viewpoint of obtaining the effect of reducing the ON resistance, it is preferable that the second film thickness t2 is at least about 3 nm thicker than the first film thickness t1.

In the semiconductor memory device of the first embodiment, the channel region 10x is set in a junctionless transistor doped with the n-type impurities such that the ON resistance of the transistor is reduced as compared with a normal type transistor in which an inversion layer is formed. Accordingly, the ON resistance of the memory string MS is also reduced. The first film thickness t1 of the channel region 10x is preferably between 1 nm and 5 nm. When the first film thickness t1 is below the above range, the ON resistance may be too large. When the first film thickness t1 exceeds the above range, it becomes difficult to deplete the channel region 10x, and there is a concern that the transistor cannot be cut off (turned off).

The n-type impurity concentration in the channel region 10x is preferably $1 \times 10^{17}$ cm$^{-3}$ to $1 \times 10^{19}$ cm$^{-3}$. When the n-type impurity concentration is below this range, the ON resistance may become too large. When the n-type impurity concentration exceeds the this range, it becomes difficult to deplete the channel region 10x and there is a concern that the transistor cannot be cut off.

The n-type impurity concentration in the embedded region 10y is preferably $1 \times 10^{19}$ cm$^{-3}$ to $1 \times 10^{21}$ cm$^{-3}$. When the n-type impurity concentration is below the this range, there is a concern that the ON resistance reduction effect cannot be obtained. When the n-type impurity concentration exceeds the this range, it is difficult to manufacture the semiconductor memory device.

As described above, in the semiconductor memory device according to the first embodiment, providing the embedded region 10y allows an increase in the number of stacked layers of stacked body 50, and a semiconductor memory device having a larger storage density can thus be achieved.

Second Embodiment

The semiconductor memory device according to a second embodiment is different from the first embodiment in that the channel region 10x is a p-type semiconductor material. In the following, description of aspects of the second embodiment which are redundant to that in the first embodiment will be omitted.

Figure 16:
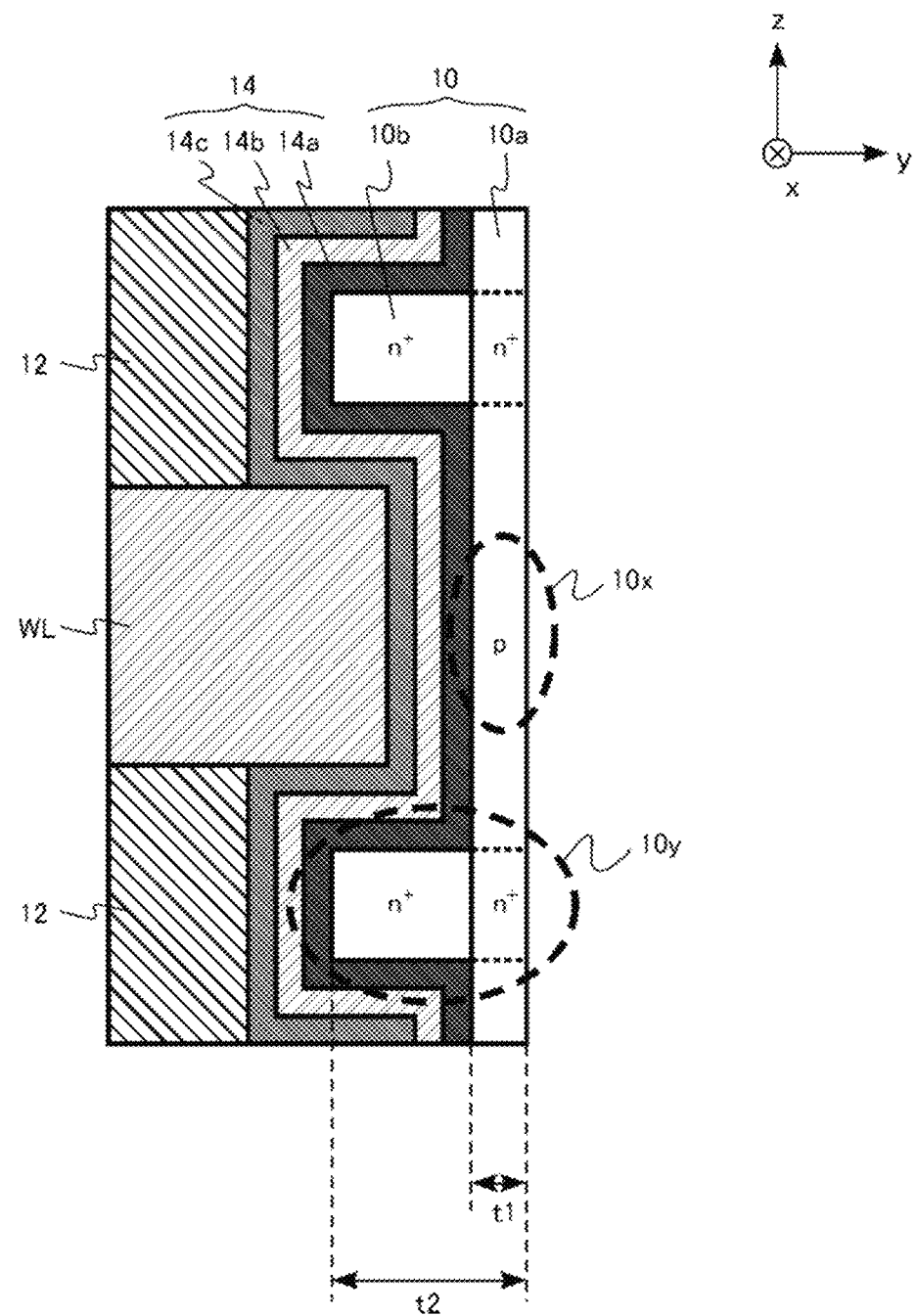
FIG. 16 is an enlarged schematic cross-sectional diagram of a portion of a memory string of the semiconductor memory device according to a second embodiment.

FIG. 16 is an enlarged schematic cross-sectional diagram of a portion of the memory string MS of a semiconductor memory device according to the second embodiment. In FIG. 16, specific illustration of the core insulation layer 16 is omitted. FIG. 16 illustrates a cross section of a memory cell transistor MT.

The semiconductor layer 10 has a channel region 10x and an embedded region 10y.

The channel region 10x is a p-type semiconductor material. The memory cell transistors MT of the semiconductor memory device according to the second embodiment is a normal type n-channel transistor in which an inversion layer is formed in the channel region 10x in an ON state.

Also, in the second embodiment, the effect of reducing the parasitic resistance R by providing the embedded region 10y is achieved in the same manner as in the first embodiment.

In the semiconductor memory device according to the second embodiment, providing the embedded region 10y allows the increase of the number of stacked layers of the stacked body 50 and the semiconductor memory device having a large storage density is achieved in a manner similar to that described above for the first embodiment.

Third Embodiment

A semiconductor memory device according to a third embodiment is different from the first embodiment in that the memory cell transistors MT have a floating gate structure. In the following, description of aspects of the third embodiment which are redundant to that in the first embodiment will be omitted.

Figure 17:
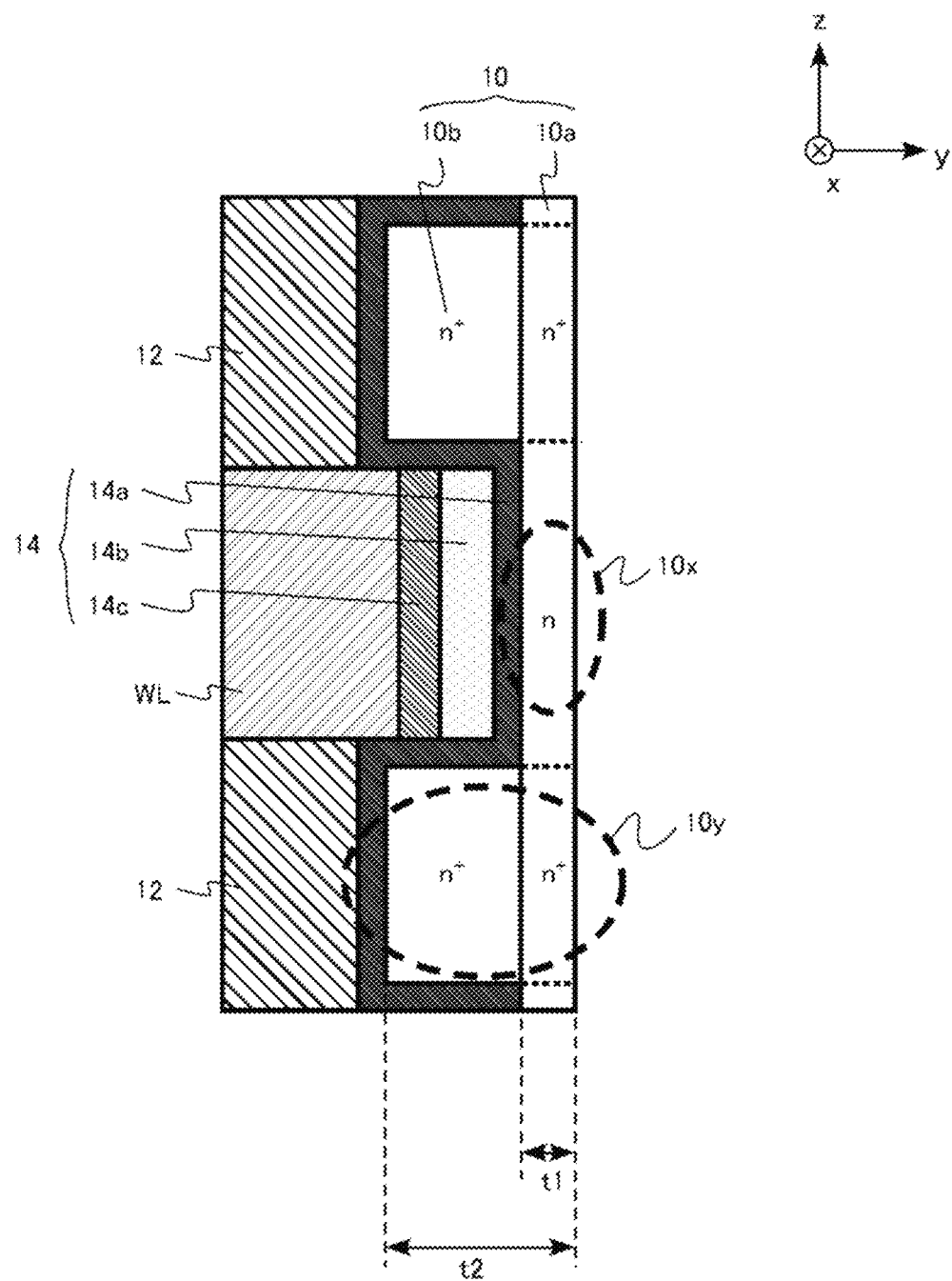
FIG. 17 is an enlarged schematic cross-sectional diagram of a portion of a memory string of a semiconductor memory device according to a third embodiment.

FIG. 17 is an enlarged schematic cross-sectional diagram of a portion of the memory string MS of the semiconductor memory device according to a third embodiment. In FIG. 17, specific illustration of the core insulation layer 16 is omitted. FIG. 17 illustrates a cross section of a memory cell transistor MT.

The semiconductor layer 10 has the channel region $10x$ and the embedded region $10y$.

The charge accumulation region 14 has the tunnel insulation film $14a$, the polycrystalline silicon film $14b$, and the block insulation film $14c$. The polycrystalline silicon film $14b$ has a function of accumulating electric charges.

The memory cell transistors MT in the third embodiment have a so-called floating gate structure.

The effect of reducing the parasitic resistance R due to provision of the embedded region $10y$ is achieved in a similar manner as in the first embodiment.

In the semiconductor memory device according to the third embodiment, providing the embedded region $10y$ allows the increase of the number of stacked layers of the stacked body 50 and a semiconductor memory device having a large storage density is achieved in a manner similar to that described above for the first embodiment.

In the first to third embodiments, although the memory cell transistors MT were an-channel transistors using electrons as carriers, the embodiments can be modified such memory cell transistors MT are p-channel type transistors. In that case, the first conductivity type in the above examples may be read as p-type rather than n-type.

In the first to third embodiments, although the cases where the channel region $10x$ is an n-type semiconductor or a p-type semiconductor were described as examples, the channel region $10x$ may be an i-type semiconductor (intrinsic semiconductor).

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
a plurality of conductive layers;
a plurality of insulation layers alternately stacked along a first direction with the plurality of conductive layers, each conductive layer being between a pair of insulation layers in the first direction;
a core member extending in the first direction through the plurality of insulation layers and the plurality of conductive layers;
a semiconductor layer on an outer periphery of the core member and including a first region facing, in a second direction crossing the first direction, one of the conductive layers and a second region adjacent, in the first direction, to the first region and facing, in the second direction, one of the insulation layers, the first region having a first thickness along the second direction from the outer periphery of the core member and a first impurity concentration, the second region having a second thickness along the second direction from the outer periphery of the core member that is greater than the first thickness and a second impurity concentration different from the first impurity concentration; and
a charge accumulation film between the semiconductor layer and the conductive layer in the second direction.

2. The semiconductor memory device according to claim 1, wherein
the first impurity concentration is n type, and
the second impurity concentration is n+ type.

3. The semiconductor memory device according to claim 2, wherein the first impurity concentration for n-type dopants is in range of $1 \times 10^{17}$ cm$^{-3}$ to $1 \times 10^{19}$ cm$^{-3}$.

4. The semiconductor memory device according to claim 2, wherein the second impurity concentration for n-type dopants is in a range of $1 \times 10^{19}$ cm$^{-3}$ to $1 \times 10^{21}$ cm$^{-3}$.

5. The semiconductor memory device according to claim 1, wherein
the first impurity concentration is p type, and
the second impurity concentration is n+ type.

6. The semiconductor memory device according to claim 1, wherein
the first and second regions are doped with an impurity of a first type,
the first and second impurity concentrations are levels of the impurity of the first type, and
the second impurity concentration is greater than the first impurity concentration.

7. The semiconductor memory device according to claim 1, wherein the first thickness is in a range of 1 nm to 5 nm.

8. The semiconductor memory device according to claim 1, wherein the second thickness is at least 3 nm thicker than the first thickness.

9. The semiconductor memory device according to claim 1, wherein the semiconductor layer is polycrystalline silicon.

10. The semiconductor memory device according to claim 1, wherein the second region is doped with phosphorus or arsenic.

11. The semiconductor memory device according to claim 1, wherein the core member is an insulating material.

12. The semiconductor memory device according to claim 1, wherein the first and second regions are in direct contact with each other.

13. A semiconductor memory device, comprising:
a stack of insulating layers and conductive layers alternating with one another along a first direction orthogonal to layer planes of the insulating and conductive layers; and
a plurality of core members spaced from each other in a second direction parallel to the layer planes of the insulating and conductive layers, each core member extending through the stack in the first direction, wherein
a first semiconductor portion is on an outer periphery of each core member between the core member and each conductive layer in the stack in the second direction, the first semiconductor portion having a first thickness in the second direction from the core member and a first impurity concentration, and
a second semiconductor portion is on the outer periphery of each core member between the core member and each insulating layer in the stack, the second semiconductor portion having a second thickness in the second direction from the core member that is greater than the first thickness and a second impurity concentration that is different from the first impurity concentration.

14. The semiconductor memory device according to claim 13, wherein
the first impurity concentration is n type, and
the second impurity concentration is n+ type.

15. The semiconductor memory device according to claim 13, wherein
the first impurity concentration is p type, and
the second impurity concentration is n+ type.

16. The semiconductor memory device according to claim 13, further comprising:
a charge accumulation film between the first semiconductor portions and the conductive layers in the second direction and between the second semiconductor portions and the insulating layers in the second direction.

* * * * *